(12) United States Patent
Bazes

(10) Patent No.: US 6,278,323 B1
(45) Date of Patent: Aug. 21, 2001

(54) HIGH GAIN, VERY WIDE COMMON MODE RANGE, SELF-BIASED OPERATIONAL AMPLIFIER

(75) Inventor: Mel Bazes, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/547,748

(22) Filed: Apr. 12, 2000

(51) Int. Cl.$^7$ ....................................................... H03F 3/45
(52) U.S. Cl. ............................................ 330/257; 330/261
(58) Field of Search ................................... 330/253, 257, 330/261, 277, 288, 300

(56) References Cited

U.S. PATENT DOCUMENTS

| | | | |
|---|---|---|---|
| 4,887,048 | * 12/1989 | Krenik et al. | 330/258 |
| 4,958,133 | 9/1990 | Bazes | 330/253 |
| 5,337,008 | * 8/1994 | Badyal | 330/257 |
| 5,963,053 | * 10/1999 | Manohar et al. | 326/60 |
| 6,052,025 | * 4/2000 | Chang et al. | 330/253 |

OTHER PUBLICATIONS

Mel Bazes, "Two Novel Fully Complementary Self–Biased CMOS Differential Amplifiers", 1991 IEEE, pp. 165–168.
John A. Fisher and Rudolf Koch, "A Highly Linear CMOS Buffer Amplifier", IEEE Journal of Solid–State Circuits, vol. SC–22, No. 3, Jun. 1987, pp. 330–334.
Klaas Bult and Govert J.G.M. Geelen, "A fast–Settling CMOS Op Amp for SC Circuits with 90–dB DC Gain", IEEE Journal of Solid–State Circuits, vol. 25, No. 6, Dec. 1990, pp. 1379–1384.
Richard E. Vallee and Ezz I. E1–Masry, "A Very High–Frequency CMOS Complementary Folded Cascode Amplifier", IEEE Journal of Solid–State Circuits, vol. 29, No. 2, Feb. 1994, pp. 130–133.

* cited by examiner

Primary Examiner—Robert Pascal
Assistant Examiner—Khanh Van Nguyen
(74) Attorney, Agent, or Firm—Seth Z. Kalson

(57) ABSTRACT

A high gain, very wide common mode range, self-biased operational amplifier comprising complementary differential transistor pairs biased by biasing transistors and current mirrors, and further comprising cascode transistors to provide a high amplifier output impedance, wherein the biasing transistors, current mirrors, and cascode transistors are all self-biased via negative feedback.

17 Claims, 1 Drawing Sheet

HIGH GAIN, VERY WIDE COMMON MODE RANGE, SELF-BIASED OPERATIONAL AMPLIFIER

FIELD

Embodiments of the present invention relate to analog circuits, and more particularly, to operational amplifiers.

BACKGROUND

Many prior art CMOS (Complementary-Metal-Oxide-Semiconductor) operational amplifiers rely upon external biasing in order to bias in the saturation region various FETs (Field-Effect-Transistor) that serve as current sources (or active loads) in the operational amplifiers. However, external biasing may be sensitive to process technology, supply voltage, and temperature. Furthermore, because the overall gain and output resistance of an operational amplifier may both be very high and difficult to accurately model, the output node voltages for zero differential input voltage is very difficult to predict. In general, these node voltages should be at or near $V_{cc}/2$ for zero differential input voltage, where $V_{cc}$ is the supply voltage.

Other prior art operational amplifiers have utilized various methods of self-biasing with negative feedback, so that the output node voltages are nominally at $V_{cc}/2$. However, for some of these prior art operational amplifiers, external biasing is not completely eliminated, and for others, some or all the FETs that serve as the current sources are biased in their linear region instead of their saturation region, resulting in reduced voltage gain. The present invention addresses these problems.

DESCRIPTION OF EMBODIMENTS

Figure 1:
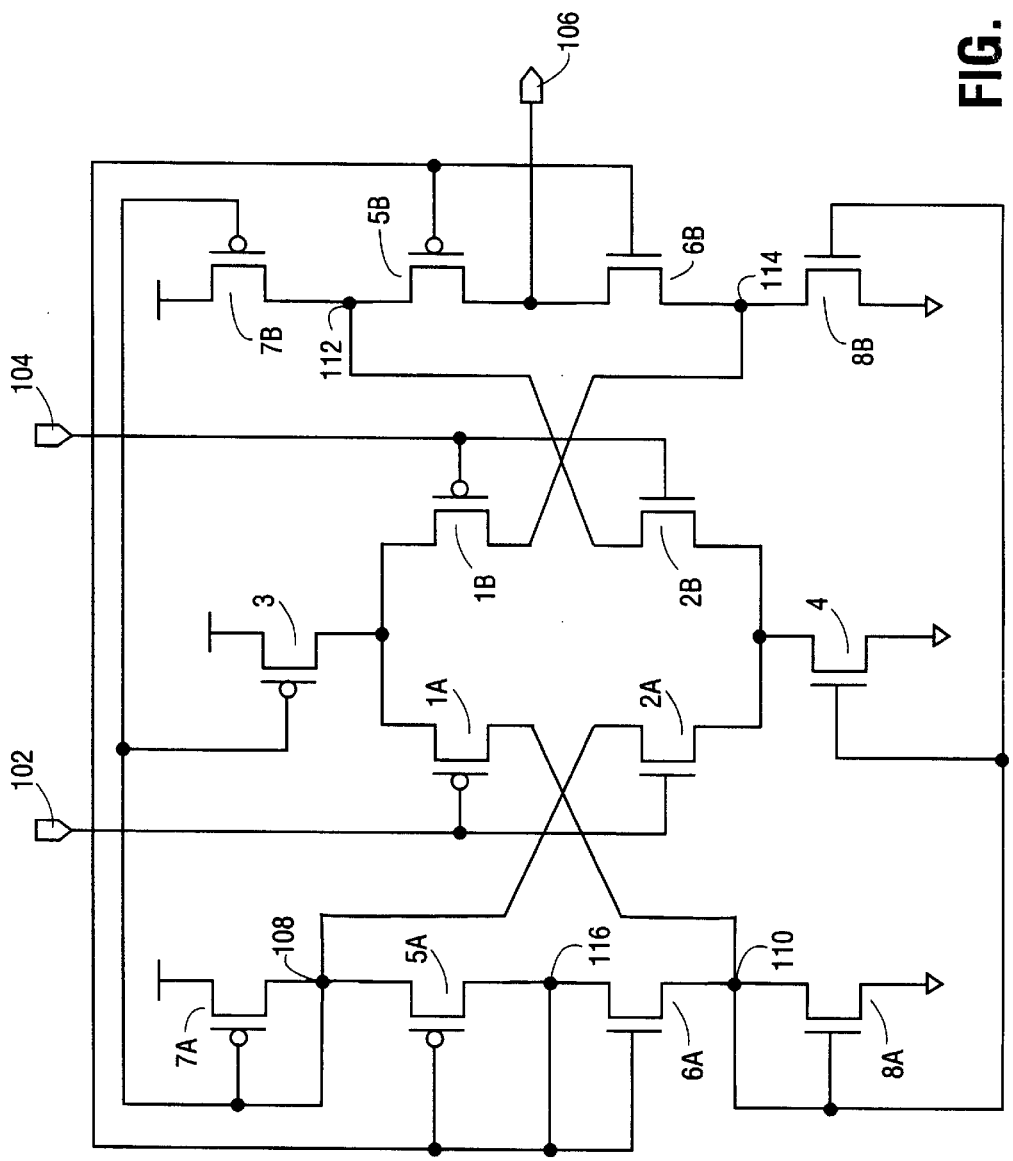
FIG. 1 is a circuit for an embodiment of the present invention.

FIG. 1 is a circuit for an embodiment of a high gain, very wide common mode range, self-biased operational amplifier. The operational amplifier of FIG. 1 may be considered a transconductance amplifier, in that a small-signal current is provided to a load in response to a differential voltage at input nodes 102 and 104. The load in FIG. 1 may be taken as the output resistance of transistor 5B in parallel with transistor 6B. The operational amplifier of FIG. 1 is self-biasing because no external biasing is needed.

Transistors 1A and 1B are pMOSFETs (p-Metal-Oxide-Semiconductor-Field-Effect-Transistor) arranged as a first differential pair of transistors having their sources connected to each other, and transistors 2A and 2B are nMOSFETs arranged as a second differential pair having their sources connected to each other. The two differential pairs are complementary to each other in that they comprise transistors having complementary carrier types, i.e., transistors 1A and 1B are of p-carrier type and transistors 2A and 2B are of n-carrier type. The gates of transistors 1A and 2A are connected to input node 102, and the gates of transistors 1B and 2B are connected to input node 104.

Transistor 3 sources bias current to the differential pair 1A and 1B. Transistors 8A and 8B comprise a current mirror. Transistor 8A sinks bias currents from transistors 1A and 6A, and transistor 8B sinks bias currents from transistors 1B and 6B. The bias current sourced by transistor 3 is equal in magnitude to the sum of the bias currents sunk by transistors 1A and 1B. When the voltage differential between nodes 102 and 104 is zero, transistors 8A and 8B sink equal bias currents.

Similarly, transistors 7A and 7B comprise a current mirror. Transistor 7A sources bias currents to transistors 2A and 5A, and transistor 7B sources bias currents to transistors 2B and 5B. Transistor 4 sinks bias current from the differential pair 2A and 2B. The bias current sunk by transistor 4 is equal in magnitude to the sum of the bias currents sourced by transistors 2A and 2B. When the voltage differential between nodes 102 and 104 is zero, transistors 7A and 7B source equal bias currents.

The gate of transistor 7A is connected to its drain, as well as to the gates of transistors 3 and 7B. Because the gate of transistor 7A is connected to its drain, it is biased in its saturation region as long as its gate-source voltage $V_{GS}$ is more negative than $V_{TP}$, the pMOSFET threshold voltage. Consequently, transistors 3 and 7B are also biased in their saturation regions within a margin of $V_{TP}$. Similarly, the gate of transistor 8A is connected to its drain, as well as to the gates of transistors 4 and 8B. Because the gate of transistor 8A is connected to its drain, it is biased in its saturation region as long as its gate-source voltage $V_{GS}$ is more positive than $V_{TN}$, the nMOSFET threshold voltage. Consequently, transistors 4 and 8B are also biased in their saturation regions within a margin of $V_{TN}$.

Transistors 2B and 5B are arranged as a folded-cascode pair. Transistor 5B is a pMOSFET, so that the folded-cascode pair 2B and 5B is comprised of transistors having complementary carrier types. Cascode transistor 5B provides impedance translation. That is, the impedance at node 112 is very much smaller than the impedance at node 106. Similarly, transistors 1B and 6B are arranged as a folded-cascode pair with complementary carrier types, where the impedance at node 114 is much smaller than the impedance at node 106. The use of cascode transistors 5B and 6B provides a high output impedance, which helps to provide a high amplifier gain because gain is determined by the product of the input transconductance and the output impedance.

Transistors 5A and 2A, and transistors 6A and 1A, are arranged as folded-cascode pairs having complementary carrier types. The gate of transistor 5A is connected to its drain, and the gate of transistor 6A is connected to its drain, so that transistors 5A and 6A are biased in their saturation regions. The gates and drains of transistors 5A and 6A, which are at the same potential, are connected to the gates of transistors 5B and 6B and, thereby, bias them.

The complementary arrangement of the amplifier of FIG. 1 provides for a very wide common mode range of operation, as reasoned as follows. If the common mode input voltage is low such that transistors 2A and 2B are in cut-off, then transistors 1A and 1B will still be ON and will continue to amplify. Conversely, if the common mode input voltage is high such that transistors 1A and 1B are in cut-off, then transistors 2A and 2B will still be ON and will continue to amplify. In this way, the amplifier of FIG. 1 will provide amplification over a wide common mode input voltage range.

The self-biasing arrangement of the amplifier of FIG. 1 creates negative-feedback loops that stabilize the various bias voltages. Variations in processing parameters or operating conditions that shift the bias voltages away from their nominal values result in a shift in the bias voltages so as to be self-correcting.

Furthermore, the self-biasing arrangement of the embodiment of FIG. 1 also contributes to its differential gain, which may be heuristically argued as follows. Suppose input node 102 goes HIGH and input node 104 goes LOW. Small-signal current is drawn from nodes 108 and 110 by transistors 2A and 1A, respectively, and small-signal current is injected into nodes 112 and 114 by transistors 2B and 1B, respectively. With small-signal current injected into nodes 112 and 114, more current will be sourced into transistor 5B, and less current will be sunk from transistor 6B, and as a result, node 106 will go HIGH. In addition, because small-signal current is drawn from nodes 108 and 110, these nodes go LOW. Because the gates of transistors 3 and 7B are connected to node 108, they conduct more strongly, thereby causing the voltage at node 106 to go even higher. Furthermore, because the gates of transistors 4 and 8B are connected to node 110, these transistors conduct more weakly, thereby also causing the voltage at node 106 to go still even higher.

Various modifications may be made to the described embodiments without departing from the scope of the invention as claimed below.

I claim:

1. An amplifier comprising:
   a first differential pair comprising first and second transistors;
   a first bias transistor to provide bias current to the first differential pair;
   a first current mirror comprising first and second transistors to sink, respectively, currents from the first and second transistors of the first differential pair;
   a second differential pair comprising first and second transistors;
   a second bias transistor to sink current from the second differential pair; and
   a second current mirror comprising first and second transistors to source, respectively, currents to the first and second transistors of the second differential pair;
   wherein the second transistor of the second current mirror is coupled to be self-biased in its saturation region, and is coupled to bias the first transistor of the second current mirror and the first bias transistor.

2. The amplifier as set forth in claim 1, further comprising:
   a first input node having a first input voltage; and
   a second input node having a second input voltage; wherein
   the second transistor of the second current mirror has a gate and a drain connected to each other, and the first transistor of the second current mirror and the first bias transistor have gates connected to the gate of the second transistor of the second current mirror;
   the first and second transistors of the first differential pair are unipolar transistors of a first carrier type;
   the first and second transistors of the second differential pair are unipolar transistors of a second carrier type complementary to the first carrier type;
   the first transistors of the first and second differential pairs have gates coupled to the first input node to be responsive to the first input voltage; and
   the second transistors of the first and second differential pairs have gates coupled to the second input node to be responsive to the second input voltage.

3. The amplifier as set forth in claim 1, wherein
   the second transistor of the second current mirror has a gate and a drain connected to each other, and the first transistor of the second current mirror and the first bias transistor have gates connected to the gate of the second transistor of the second current mirror; and
   the second transistor of the first current mirror has a gate and a drain connected to each other, and wherein the first transistor of the first current mirror and the second bias transistor have gates connected to the gate of the second transistor of the first current mirror.

4. The amplifier as set forth in claim 3, further comprising:
   a first input node having a first input voltage; and
   a second input node having a second input voltage; wherein
   the first and second transistors of the first differential pair, the first bias transistor, and the first and second transistors of the second current mirror, are unipolar transistors of a first carrier type;
   the first and second transistors of the second differential pair, the second bias transistor, and the first and second transistors of the first current mirror, are unipolar transistors of a second carrier type complementary to the first carrier type;
   the first transistors of the first and second differential pairs have gates coupled to the first input node to be responsive to the first input voltage; and
   the second transistors of the first and second differential pairs have gates coupled to the second input node to be responsive to the second input voltage.

5. The amplifier as set forth in claim 3, further comprising:
   a first cascode transistor coupled to the first transistor of the first differential pair to form a folded-cascode pair;
   a second cascode transistor coupled to the second transistor of the first differential pair to form a folded-cascode pair;
   a third cascode transistor coupled to the first transistor of the second differential pair to form a folded-cascode pair; and
   a fourth cascode transistor coupled to the second transistor of the second differential pair to form a folded-cascode pair, wherein
   the fourth cascode transistor has a gate and a drain connected to each other;
   the second cascode transistor has a gate and a drain connected to each other; and
   the first, second, third, and fourth cascode transistors have their gates connected to each other.

6. The amplifier as set forth in claim 5, further comprising:
   a first input node having a first input voltage;
   a second input node having a second input voltage; and
   an output node having an output voltage; wherein
   the first and second transistors of the first differential pair, the first bias transistor, the first and second transistors of the second current mirror, and the third and fourth cascode transistors, are unipolar transistors of a first carrier type;
   the first and second transistors of the second differential pair, the second bias transistor, the first and second transistors of the first current mirror, and the first and second cascode transistors, are unipolar transistors of a second carrier type complementary to the first carrier type;
   the first transistors of the first and second differential pairs have gates coupled to the first input node to be responsive to the first input voltage;
   the second transistors of the first and second differential pairs have gates coupled to the second input node to be responsive to the second input voltage; and the first and third cascode transistors have drains coupled to the output node to provide the output voltage, wherein the output voltage is an amplified difference of the first and second input voltages.

7. An amplifier comprising:
a first differential pair comprising first and second transistors;
a first bias transistor to provide bias current to the first differential pair;
a first current mirror comprising first and second transistors to sink, respectively, drain currents from the first and second transistors of the first differential pair;
a second differential pair comprising first and second transistors;
a second bias transistor to sink current from the second differential pair; and
a second current mirror comprising first and second transistors to source, respectively, drain currents to the first and second transistors of the second differential pair;
wherein the second transistor of the second current mirror has a gate and a drain coupled to each other to be biased in its saturation region, and the first transistor of the second current mirror and the first bias transistor have gates coupled to the gate of the second transistor of the second current mirror to be biased in their saturation regions.

8. The amplifier as set forth in claim 7, further comprising:
a first input node having a first input voltage; and
a second input node having a second input voltage; wherein
the first and second transistors of the first differential pair are unipolar transistors of a first carrier type;
the first and second transistors of the second differential pair are unipolar transistors of a second carrier type complementary to the first carrier type;
the first transistors of the first and second differential pairs have gates coupled to the first input node to be responsive to the first input voltage; and
the second transistors of the first and second differential pairs have gates coupled to the second input node to be responsive to the second input voltage.

9. The amplifier as set forth in claim 7, wherein
the second transistor of the first current mirror has a gate and a drain coupled to each other to be biased in its saturation region, and wherein the first transistor of the first current mirror and the second bias transistor have gates coupled to the gate of the second transistor of the first current mirror to be biased in their saturation region.

10. The amplifier as set forth in claim 9, further comprising:
a first input node having a first input voltage; and
a second input node having a second input voltage; wherein
the first and second transistors of the first differential pair, the first bias transistor, and the first and second transistors of the second current mirror, are unipolar transistors of a first carrier type;
the first and second transistors of the second differential pair, the second bias transistor, and the first and second transistors of the first current mirror, are unipolar transistors of a second carrier type complementary to the first carrier type;
the first transistors of the first and second differential pairs have gates coupled to the first input node to be responsive to the first input voltage; and
the second transistors of the first and second differential pairs have gates coupled to the second input node to be responsive to the second input voltage.

11. The amplifier as set forth in claim 9, further comprising:
a first cascode transistor coupled to the first transistor of the first differential pair to form a folded-cascode pair;
a second cascode transistor coupled to the second transistor of the first differential pair to form a folded-cascode pair;
a third cascode transistor coupled to the first transistor of the second differential pair to form a folded-cascode pair; and
a fourth cascode transistor coupled to the second transistor of the second differential pair to form a folded-cascode pair; wherein
the fourth cascode transistor has a gate and a drain coupled to each other so as to be self-biased;
the second cascode transistor has a gate and a drain coupled to each other so as to be self-biased; and
the first, second, third, and fourth cascode transistors have their gates coupled to each other so as to be self-biased.

12. The amplifier as set forth in claim 11, further comprising:
a first input node having a first input voltage;
a second input node having a second input voltage; and
an output node having an output voltage; wherein
the first and second transistors of the first differential pair, the first bias transistor, the first and second transistors of the second current mirror, and the third and fourth cascode transistors, are unipolar transistors of a first carrier type;
the first and second transistors of the second differential pair, the second bias transistor, the first and second transistors of the first current mirror, and the first and second cascode transistors, are unipolar transistors of a second carrier type complementary to the first carrier type;
the first transistors of the first and second differential pairs have gates coupled to the first input node to be responsive to the first input voltage;
the second transistors of the first and second differential pairs have gates coupled to the second input node to be responsive to the second input voltage; and
the first and third cascode transistors have drains coupled to the output node to provide the output voltage, wherein the output voltage is an amplified difference of the first and second input voltages.

13. An amplifier comprising:
a first differential transistor pair;
a first bias transistor to source bias current to the first differential transistor pair;
a first current mirror comprising first and second transistors to sink bias current from the first differential transistor pair;
a first cascode transistor coupled to the first differential transistor pair to form a folded-cascode pair;
a second cascode transistor coupled to the first differential pair to form a folded-cascode pair;
a second differential transistor pair;

a second bias transistor to sink bias current from the second differential transistor pair;

a second current mirror comprising first and second transistors to source bias current to the second differential transistor pair;

a third cascode transistor coupled to the second differential transistor pair to form a folded-cascode pair; and a fourth cascode transistor coupled to the second differential pair to form a folded-cascode pair; wherein the second and fourth cascode transistors are coupled to be biased in saturation, and are coupled to bias the first and third cascode transistors;

the second transistor of the first current mirror is coupled to be biased in saturation, and is coupled to bias the first transistor of the first current mirror and the second bias transistor; and the second transistor of the second current mirror is coupled to be biased in saturation, and is coupled to bias the first transistor of the second current mirror and the first bias transistor.

14. The amplifier as set forth in claim 13, wherein the first differential pair comprises first and second transistors;

the second differential pair comprises first and second transistors;

the first and second transistors of the first differential pair, the first bias transistor, the first and second transistors of the second current mirror, and the third and fourth cascode transistors are field-effect-transistors having a first carrier type; and the first and second transistors of the second differential pair, the second bias transistor, the first and second transistors of the first current mirror, and the first and second cascode transistors are field-effect-transistors having a second carrier type complementary to the first carrier type.

15. An operational amplifier to provide an output voltage as an amplified output of a differential of first and second input voltages, the operational amplifier comprising:

a first input node at the first input voltage;

a second input node at the second input voltage;

a first pFET comprising a source, a drain, and a gate coupled to the first input node to be responsive to the first input voltage;

a first nFET comprising a gate, and a drain coupled to the drain of the first pFET to sink current from the first pFET;

a second nFET comprising a source, a drain, and a gate coupled to the second input node to be responsive to the second input voltage;

a second pFET comprising a gate, and a drain coupled to the drain of the second nFET to source current to the second nFET, wherein the gate and drain of the second pFET are coupled to each other to have substantially the same voltage; and a third pFET comprising a gate, and a drain coupled to the source of the first pFET to source current to the first pFET, wherein the gates of the third pFET and second pFET are coupled to each other to have substantially the same voltage.

16. The operational amplifier as set forth in claim 15, further comprising:

a third nFET comprising a source, a drain, and a gate coupled to the first input node to be responsive to the first input voltage;

a fourth pFET comprising a gate, wherein the gates of the fourth pFET and second pFET are coupled to each other to have substantially the same voltage, and comprising a drain coupled to the drain of the third nFET to source current to the third nFET;

a fifth pFET comprising a gate coupled to the second input node to be responsive to the second input voltage, a source coupled to the drain of the third pFET to sink current from the third pFET, and a drain;

a fourth nFET comprising a gate and a drain, wherein the gate and drain of the fourth nFET are coupled to each other to have substantially the same voltage, wherein the gates of the fourth nFET and first nFET are coupled to each other to have substantially the same voltage, and the drain of the fourth nFET is coupled to the drain of the fifth pFET to sink current from the fifth pFET; and a fifth nFET comprising a gate, wherein the gates of the fifth nFET and fourth nFET are coupled to each other to have substantially the same voltage, and comprising a drain coupled to the sources of the second nFET and third nFET to sink current from the second nFET and third nFET.

17. The operational amplifier as set forth in claim 16, further comprising:

a sixth pFET comprising a source coupled to the drain of the second pFET to sink current from the second pFET, a gate, and a drain, wherein the gate and drain of the sixth pFET are coupled to each other to have substantially the same voltage;

a sixth nFET comprising a gate and a drain coupled to each other to have substantially the same voltage, wherein the gates of the sixth nFET and sixth pFET are coupled to each other to have substantially the same voltage, and comprising a drain coupled to the drain of the sixth pFET to sink current from the sixth pFET, and a source coupled to the drain of the fourth nFET to source current to the fourth nFET;

a seventh pFET comprising a source coupled to the drain of the fourth pFET to sink current from the fourth pFET, comprising a gate, wherein the gates of the seventh pFET and sixth pFET are coupled to each other to have substantially the same voltage, and comprising a drain coupled to the output node; and a seventh nFET comprising a gate, wherein the gates of the seventh nFET and sixth pFET are coupled to each other to have substantially the same voltage, and comprising a drain coupled to the drain of the seventh pFET to sink current from the seventh pFET, and a source coupled to the drain of the first nFET to source current to the first nFET.

* * * * *